US009831408B2

(12) United States Patent
Kawano et al.

(10) Patent No.: US 9,831,408 B2
(45) Date of Patent: Nov. 28, 2017

(54) LIGHT EMITTING DEVICE (71) Applicant: TOYODA GOSEI CO., LTD., Kiyosu-shi (JP)

(72) Inventors: Eiki Kawano, Kiyosu (JP); Masayuki Kaneko, Kiyosu (JP); Norifumi Hattori, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 6 days.

(21) Appl. No.: 15/073,305

(22) Filed: Mar. 17, 2016

(65) Prior Publication Data

US 2016/0300989 A1 Oct. 13, 2016

(30) Foreign Application Priority Data

Apr. 9, 2015 (JP) ................................. 2015-080354

(51) Int. Cl.
*H01L 33/62* (2010.01)
*H01L 33/48* (2010.01)

(52) U.S. Cl.
CPC ............ *H01L 33/62* (2013.01); *H01L 33/486* (2013.01); *H01L 2224/48091* (2013.01); *H01L 2224/48247* (2013.01); *H01L 2224/48257* (2013.01); *H01L 2224/48465* (2013.01); *H01L 2224/49113* (2013.01); *H01L 2224/78301* (2013.01); *H01L 2224/85181* (2013.01); *H01L 2933/0066* (2013.01)

(58) Field of Classification Search
CPC .......... H01L 33/62; H01L 2224/49113; H01L 2224/78301; H01L 2224/85181
See application file for complete search history.

(56) References Cited

U.S. PATENT DOCUMENTS

2014/0103375 A1* 4/2014 Kobayakawa ........ H01L 33/483
257/91

FOREIGN PATENT DOCUMENTS

JP          5471244 B2   4/2014

\* cited by examiner

*Primary Examiner* — Tran Tran
(74) *Attorney, Agent, or Firm* — McGinn I. P. Law Group, PLLC.

(57) ABSTRACT

A light emitting device includes: a first lead including a first base portion having a constant thickness and a first small-thickness portion having a thickness smaller than that of the first base portion; a second lead including a second base portion having a constant thickness and a second small-thickness portion having a thickness smaller than that of the second base portion; wherein the first small-thickness portion and the second small-thickness portion face each other with a gap interposed therebetween; the length of the gap is 0.9 to 1.2 times the thickness of the edges of the first small-thickness portion and the second small-thickness portion; the length of the bonding wire in a plan view of the light emitting device is smaller than a value obtained by adding the thickness of the base portion, a width of a mounting-disabled area, and a width of a bonding-disabled area.

15 Claims, 8 Drawing Sheets

LIGHT EMITTING DEVICE

CROSS-REFERENCE TO RELATED APPLICATION(S)

This application is based upon and claims the benefit of priority from Japanese Patent Application No. 2015-080354, filed on Apr. 9, 2015, the entire contents of which are incorporated herein by reference.

BACKGROUND

1. Field of the Invention

The present invention relates to a light emitting device, and more particularly, to a light emitting device including a light emitting element, a bonding wire, a lead, and a package.

2. Description of the Related Art

As disclosed in Japanese Patent No. 5471244, the applicant of the present invention has developed a lighting device including a first lead having a mounting area in which a light emitting diode (LED) chip is mounted on the surface side thereof and exposing the rear surface side thereof, a second lead having a boning area to which a wire from the LED chip is bonded on the surface side thereof and exposing the rear surface side thereof, and a packaging resin portion surrounding the first lead and the second lead and forming an insulating area between the first lead and the second lead, in which a portion of the first lead facing the second lead is a small-thickness portion, the LED chip is mounted on the surface side of the small-thickness portion, a resin material of the packaging resin portion goes around to the rear surface side of the small-thickness portion, a portion of the second lead facing the first lead is a small-thickness portion, and the resin material of the packaging resin portion goes around to the rear surface side of the small-thickness portion.

It is preferable that the thickness of the first lead and the second lead in Japanese Patent No. 5471244 be set to be large for the purpose of promotion of heat dissipation and improvement in rigidity.

The first lead and the second lead are formed of a single metal sheet by press punching for the purpose of improvement in productivity, but the distance between an edge of the small-thickness portion in the first lead and an edge of the small-thickness portion in the second lead is defined by a width of a punch of a press punching machine. Accordingly, the larger the thickness of the leads becomes, the larger the distance becomes.

The LED chip is mounted on the first lead and the bonding wire from the LED chip is bonded to a bonding area on the surface side of the second lead.

Accordingly, when the distance becomes larger, the length of the bonding wire becomes larger, the volume of a sealing resin filled below the bonding wire becomes larger, expansion/contraction of the sealing resin due to heat becomes larger, and a stress applied to the bonding wire from the sealing resin becomes larger. As a result, there is a problem in that metal fatigue of the bonding wire increase to easily cause disconnection failure.

SUMMARY

The present invention is made to solve the above-mentioned problem and an object thereof is to provide a light emitting device that can prevent disconnection failure of a bonding wire.

According to a first aspect of the invention, there is provided a light emitting device including: a bonding wire of which a first end is bonded to a light emitting element; a first lead in which the light-emitting element is mounted on the surface thereof and the rear surface thereof is exposed; a second lead in which a second end of the bonding wire is bonded to the surface thereof and the rear surface thereof is exposed; a packaging resin portion in which the first lead and the second lead are formed by insert molding and an insulating portion is formed between the first lead and the second lead; and a sealing resin portion that seals the light emitting element and the bonding wire, wherein: the first lead includes a first base portion having a constant thickness and a first small-thickness portion connected to one side of the first base portion and having a thickness smaller than that of the first base portion; the second lead includes a second base portion having a constant thickness and a second small-thickness portion connected to one side of the second base portion and having a thickness smaller than that of the second base portion; the packaging resin portion also covers the rear surfaces of the first small-thickness portion and the second small-thickness portion; the first small-thickness portion and the second small-thickness portion face each other with a gap interposed therebetween and the insulating portion is formed in the gap; the length of the gap is 0.9 to 1.2 times the thickness of the edges of the first small-thickness portion and the second small-thickness portion; a mounting-disabled area on which the light emitting element is not mounted is set on the surface of the first small-thickness portion; a bonding-disabled area to which the bonding wire is not bonded is set on the surface of the second small-thickness portion; and the length of the bonding wire in a plan view of the light emitting device is smaller than a value obtained by adding the thickness of the base portion, the width of the mounting-disabled area, and the width of the bonding-disabled area.

According to the first aspect, since the length of the gap can be made to be less than the thickness of the base portion by forming the small-thickness portion in each lead, the length of the bonding wire in a plan view of the light emitting device can be set to be small than a value obtained by adding the thickness of the base portion, the width of the mounting-disabled area, and the width of the bonding-disabled area.

In order for the sealing resin portion to seal the bonding wire, a synthetic resin material (sealing resin) forming the sealing resin portion is filled below the bonding wire.

Accordingly, when the length of the bonding wire can be reduced as in the first aspect, the volume of the sealing resin filled below the bonding wire is reduced, expansion/contraction of the sealing resin due to heat is reduced, and a stress applied to the bonding wire from the sealing resin is reduced. As a result, it is possible to control metal fatigue of the bonding wire and to make it difficult to cause disconnection failure of the bonding wire.

A second aspect of the present invention provides the light emitting device according to the first aspect, wherein: the thickness of the first base portion and the thickness of the second base portion are equal to each other; and the thickness of the edge of the first small-thickness portion and the thickness of the edge of the second small-thickness portion are equal to each other.

According to the second aspect, since the leads are formed of a single metal sheet by press punching for the purpose of improvement in productivity, the thicknesses of the base portions are equal to each other and the thicknesses of the edges of the small-thickness portions are equal to each other.

A third aspect of the present invention provides the light emitting device according to the first aspect of the second aspect, further including: a first protruding part protruding from the surface of the edge of the first small-thickness portion; and a second protruding part protruding from the surface of the edge of the second small-thickness portion.

According to the third aspect, since the volume of the sealing resin filled below the bonding wire is reduced by the volume of the protruding parts, it is possible to more reliably achieve the operational advantages of the first aspect.

A fourth aspect of the present invention provides the light emitting device according to any one of the first, second, and third aspects, further including a bent part formed by bending and drawing the second end of the bonding wire along the surface of the second lead, the bent part being formed in a part of the bonding wire connected to the second lead.

According to the fourth aspect, since the bent part of the bonding wire serves as an elongation margin corresponding to deformation of the sealing resin portion, the stress applied to the bonding wire due to deformation of the sealing resin portion is absorbed by the bent part. Accordingly, it is possible to control metal fatigue of the bonding wire and to make it difficult to cause disconnection failure of the bonding wire.

The stress of the sealing resin portion easily affects the surroundings of the leads, that is, the surroundings of the bonding area and the bonding-disabled area, due to a difference in linear expansion coefficient. In addition, when protruding parts are present in the bonding-disabled areas, the area therebetween is affected by the stress.

The bent part of the bonding wire is bent and drawn along the surfaces of the leads so as to serve as an elongation margin corresponding to the shapes of the leads.

Since the bent parts are bent and drawn along the surface of the second lead, a gap is hardly present between the bent part and the surface of the second lead and the volume of the sealing resin filled between the bent part and the surface of the second lead is very small. Accordingly, the stress applied to the bent part from the sealing resin is very small and thus the bent part may hardly cause metal fatigue due to the stress.

A fifth aspect of the present invention provides the light emitting device according to any one of the first, second, third, and fourth aspects, wherein the length of the gap ranges from 0.1 mm to 0.2 mm.

When the length of the gap is set as described in the fifth aspect, it is possible to reliably achieve the operational advantages of the first aspect.

A sixth aspect of the present invention provides the light emitting device according to any one of the first, second, third, fourth, and fifth aspects, wherein the thickness of the base portion ranges from 0.3 mm to 0.64 mm.

When the thicknesses of the base portions of the leads are set as described in the sixth aspect, it is possible to promote dissipation of heat generated from the light emitting element from the leads to the outside and to reliably achieve the operational advantages of the first aspect.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Hereinafter, embodiments of the present invention will be described with reference to the accompanying drawings. In the embodiments, like constituent members and elements will be referenced by like reference signs and description thereof will not be repeated.

In the drawings, dimensions, shapes, and positions of the constituent members of the embodiments are exaggerated and schematically illustrated for the purpose of easy understanding of the description, and the dimensions, shapes, and positions of the constituent members do not necessarily agree to the real ones.

First Embodiment

Figure 1:
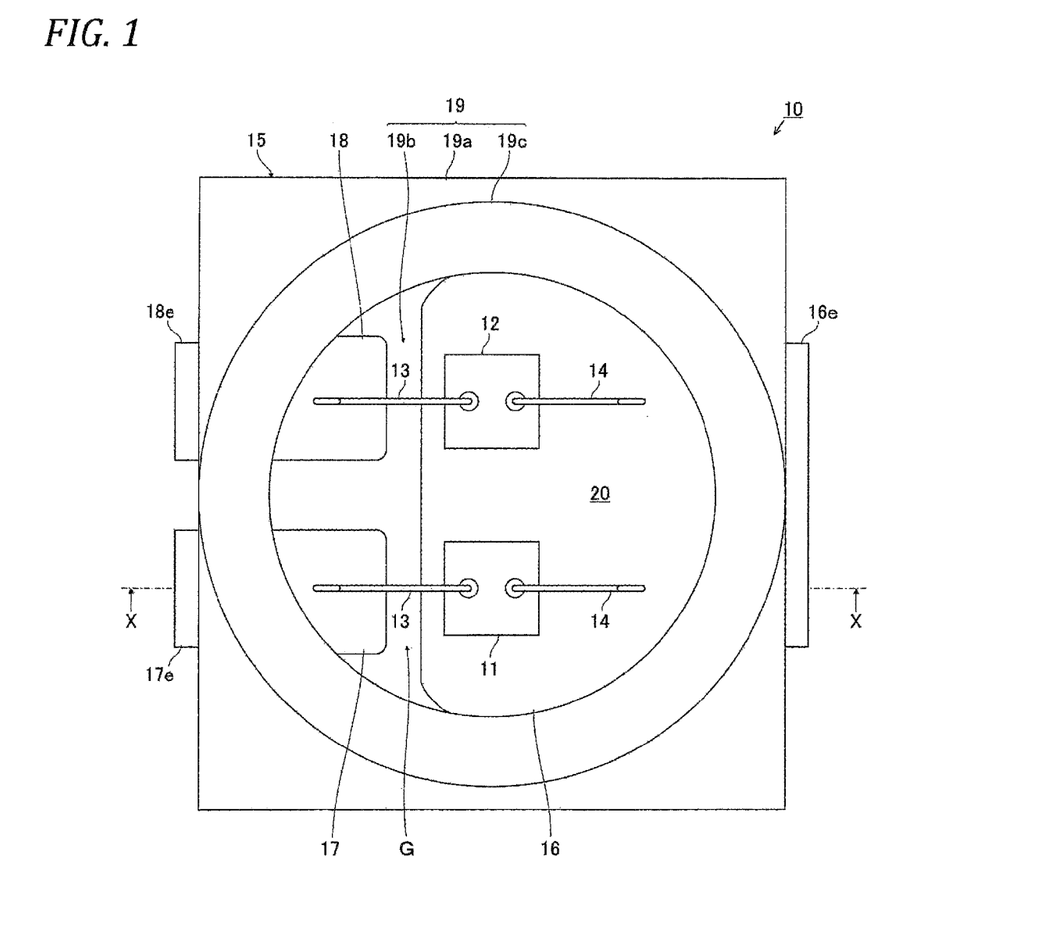
FIG. 1 is a plan view of a light emitting device 10 according to a first embodiment of the present invention.
Figure 2:
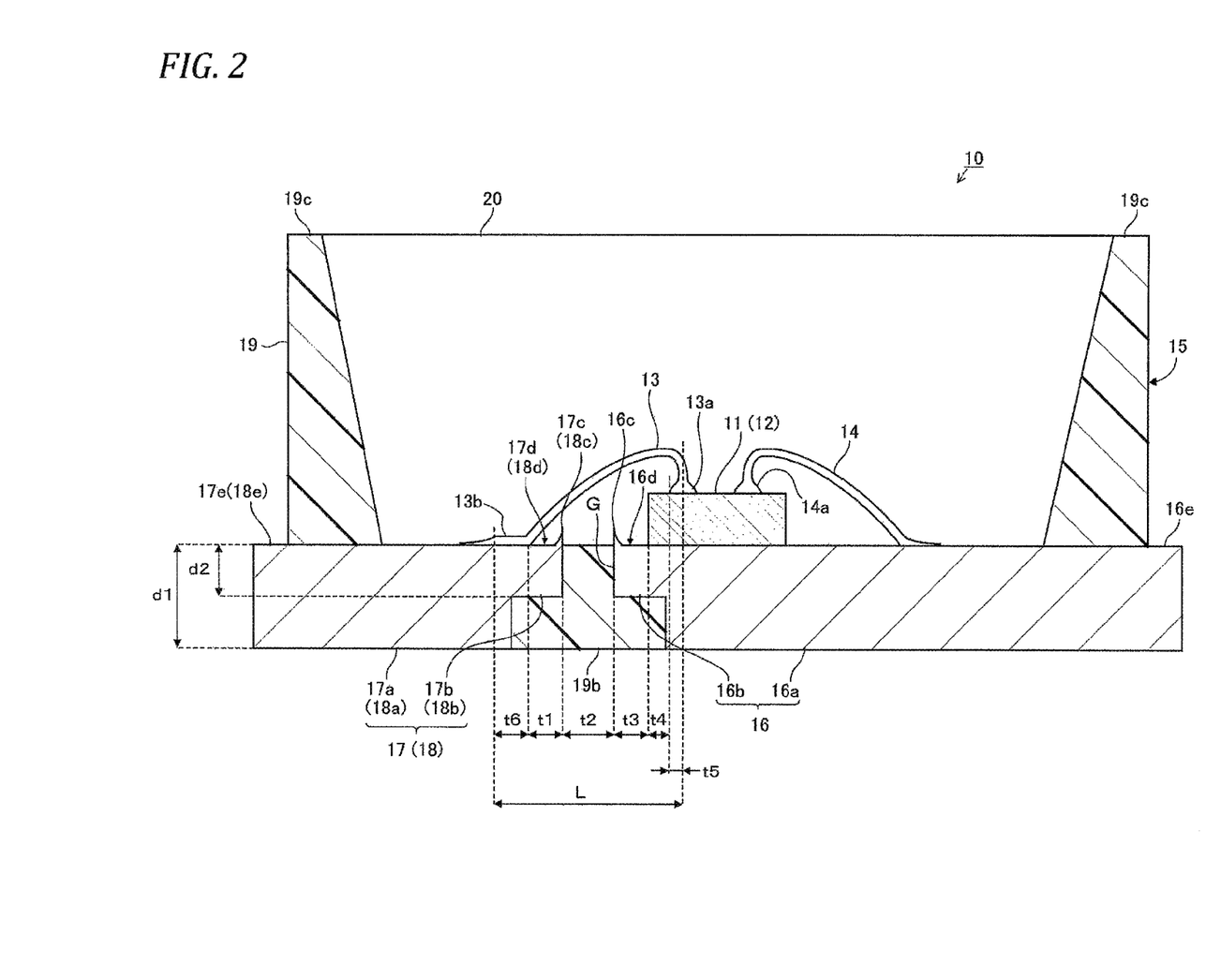
FIG. 2 is a perspective cross-sectional view of the light emitting device 10 taken along line X-X in FIG. 1.

As illustrated in FIGS. 1 and 2, a light emitting device 10 according to a first embodiment of the present invention includes LED chips 11 and 12, bonding wires 13 and 14 (wire balls 13a and 14a and bent parts 13b), a package portion 15, a first lead 16 (a first base portion 16a, a first small-thickness portion 16b, a first protruding part 16c, a mounting-disabled area 16d, and an external connection terminal 16e), a second lead 17 (a second base portion 17a, a second small-thickness portion 17b, a second protruding part 17c, a bonding-disabled area 17d, and an external connection terminal 17e), a second lead 18 (a second base portion 18a, a second small-thickness portion 18b, a second protruding part 18c, a bonding-disabled area 18d, and an external connection terminal 18e), a packaging resin portion 19 (a base portion 19a, an insulating portion 19b, and a sealing frame portion 19c), a sealing resin portion 20, and a gap G.

The light emitting device 10 is a top-view type surface-mounted (SMD) light emitting device.

The LED chips 11 and 12 having the same dimension and configuration have a flat rectangular parallelepiped shape having a substantially square shape in a plan view and are of a face-up type, in which an anode electrode and a cathode electrode are formed on the surface thereof, first ends of bonding wires 13 and 14 are ball-bonded to the electrodes (not illustrated), and wire balls 13a and 14a are formed in parts of the bonding wires 13 and 14 connected to the electrodes.

The package portion 15 includes leads (lead frames) 16 to 18 and a packaging resin portion 19.

The leads 16 to 18 are formed of a single metal sheet (such as a copper sheet or an aluminum sheet) having high electrical conductivity and thermal conductivity by press punching for the purpose of improvement in productivity.

The lead 16 includes a base portion 16a which has a constant thickness and a small-thickness portion 16b which is connected to one side of the base portion 16a and which has a thickness smaller than that of the base portion 16a.

The small-thickness portion 16b is formed at an edge of the lead 16 facing the leads 17 and 18 and the surface (top surface) of the small-thickness portion 16b is flush with the surface of the base portion 16a.

On the surface of the edge of the small-thickness portion 16b, a protruding part 16c protruding from the surface along the edge is formed.

The LED chips 11 and 12 are mounted (attached or placed) on the surface of the lead 16, and an area of the lead 16 on which each of the LED chips 11 and 12 is mounted is a mounting area.

A second end of the bonding wire 14 is wedge-bonded to the surface of the lead 16.

On the surface of the small-thickness portion 16b, a mounting-disabled area (chip mounting-disabled area) 16d on which the LED chips 11 and 12 cannot be mounted is set in an area extending from the edge of the small-thickness portion 16b to the base portion 16a.

The leads 17 and 18 having the same dimension and configuration include base portions 17a and 18a having a constant thickness and small-thickness portions 17b and 18b connected to one side of the base portions 17a and 18a and having a thickness smaller than that of the base portions 17a and 18a.

The small-thickness portions 17b and 18b are formed at the edges of the leads 17 and 18 facing the lead 16, and the surfaces of the small-thickness portions 17b and 18b are flush with the surfaces of the base portions 17a and 18b.

Protruding parts 17c and 18c protruding from the surfaces along the edges are formed on the surface of the edges of the small-thickness portions 17b and 18b.

On the surfaces of the small-thickness portions 17b and 18b, bonding-disabled areas (wire mounting-disabled area) 17d and 18d on which the bonding wire 13 cannot be mounted are set in areas extending from the edges of the small-thickness portion 17b and 18b to the base portions 17a and 18a.

The second ends of the bonding wires 13 are wedge-bonded to the surfaces of the leads 17 and 18, and areas of the leads 17 and 18 to which the bonding wires 13 are bonded are bonding areas.

Bent parts (folded parts) 13b which are formed by bending and drawing the second ends of the bonding wires 13 along the surfaces of the leads 17 and 18 are formed in parts of the bonding wires 13 bonded to the leads 17 and 18.

The packaging resin portion (case portion) 19 includes a base portion 19a, an insulating portion 19b, and a sealing frame portion 19c, which are integrally formed by injection molding of a synthetic resin material (such as an epoxy resin, a nylon resin, or a silicon resin) having high adhesion to and high insulation from the leads 16 to 18.

The leads 16 and 18 are formed in the packaging resin portion 19 by insert molding.

The rear surfaces (bottom surfaces) of the leads 16 to 18 are exposed (revealed) in the base portion 19a, and heat generated from the LED chips 11 and 12 is transmitted directly from the LED chips 11 and 12 to the lead 16 and is dissipated externally from the rear surface of the lead 16. In addition, the heat is transmitted indirectly from the LED chips 11 and 12 to the leads 16 to 18 via the bonding wires 13 and 14 and is dissipated externally from the rear surfaces of the leads 16 to 18.

The insulating portion (insulating area) 19b of the packaging resin portion 19 is a portion which is present between the leads 16 to 18 and electrically insulates the leads 16 to 18 from each other.

The small-thickness portion 16b of the lead 16 and the small-thickness portions 17b and 18b of the leads 17 and 18 face each other with a gap G interposed therebetween, and the insulating portion 19b of the packaging resin portion 19 is formed in the gap G.

In injection molding of the packaging resin portion 19, a formation material thereof goes around to the rear surface sides of the small-thickness portions 16b, 17b, and 18b of the leads 16 to 18 and the base portion 19a of the packaging resin portion 19 covers the rear surface sides of the small-thickness portions 16b, 17b, and 18b. Accordingly, even when the distances between the leads 16 to 18 are reduced, it is possible to secure mechanical connection strength (coupling strength) of the leads 16 to 18.

The edge of the base portion 16a opposite to the small-thickness portion 16b in the lead 16 is exposed from the base portion 19a of the packaging resin portion 19, and an external connection terminal 16e is formed of the exposed part of the lead 16.

The edges of the base portions 17a and 18a opposite to the small-thickness portions 17b and 18b in the leads 17 and 18 are exposed from the base portion 19a of the packaging resin portion 19, and external connection terminals 17e and 18e are formed of the exposed parts of the leads 17 and 18.

The sealing frame portion 19c of the packaging resin portion 19 has an annular shape and is connected to the surface of the base portion 19a, and the surfaces of the leads 16 to 18 are exposed to the inside of the sealing frame portion 19c.

In the inner circumferential surface of the sealing frame portion 19c, parts connected to the leads 16 to 18 are formed as inclined surfaces forming an acute angle, and the inner area of the sealing frame portion 19c increases as it is separated away from the surfaces of the leads 16 to 18.

Accordingly, the inner circumferential surface of the sealing frame portion 19c serves as a reflector that reflects light emitted from the LED chips 11 and 12 and efficiently radiates the light from the opening of the sealing frame portion 19c.

The sealing resin portion 20 is formed of a synthetic resin material (such as an epoxy resin or a silicon resin) having high adhesion to the LED chips 11 and 12, the bonding wires 13 and 14, and the leads 16 to 18 and high light transmission, and is filled in the sealing frame portion 19c to seal the LED chips 11 and 12 and the bonding wires 13 and 14.

Dimensions of Constituents in First Embodiment (See FIG. 2)

When it is intended to form the leads 16 to 18 out of a single metal sheet and to form the small-thickness portions 16b, 17b, and 18b in the leads 16 to 18, grooves are first formed in a metal sheet using an appropriate machining method (such as half punching or notching) and then the leads 16 and 18 are cut out by punching the insides of the grooves by press punching.

That is, when the leads 16 to 18 are formed of a single metal sheet by single press punching, the width of a punch needs to be set to be larger than at least 0.9 times to 1.2 times the thickness of the metal sheet in order to secure the strength of the punch (press edge) of a press punching machine. Since the distance between the leads 16 to 18 are 0.9 times to 1.2 times the width of the punch, the distance between the leads 16 to 18 becomes larger as the thickness of the leads 16 to 18 becomes larger.

Therefore, in the first embodiment, by forming grooves in the metal sheet before cutting out the leads 16 to 18 by the press punching, it is possible to reduce the magnitude t2 of the gap G to be described later and to use the bottom portions of the grooves remaining the edges of the leads 16 to 18 after the press punching as the small-thickness portions 16b, 17b, and 18b.

When the leads 16 to 18 are cut out by the press punching, the edges of the leads 16 to 18 come in close contact with the punch of the press punching machine and are drawn in the moving direction of the punch to generate burrs, whereby the protruding parts 16c, 17c, and 18c are formed of the burrs.

Since the leads 16 to 18 are formed of a single metal sheet by the press punching, the thicknesses of the base portions 16a, 17a, and 18a of the leads 16 to 18 are equal to each other.

In the small-thickness portions 16b, 17b, and 18b of the leads 16 to 18, since the grooves formed in the metal sheet as described above serve as bases, the thicknesses of the small-thickness portions 16b, 17b, and 18b are equal to each other.

The thickness d1 of the base portions 16a, 17a, and 18a of the leads 16 to 18 appropriately ranges from 0.1 mm to 1.0 mm, preferably ranges from 0.2 mm to 0.8 mm, and particularly preferably ranges from 0.3 mm to 0.64 mm.

When the thickness d1 of the base portions 16a, 17a, and 18a is greater than the range, shaping may be disabled by the press punching. When the thickness d1 is smaller than the range, satisfactory electric conductivity and thermal conductivity may not be obtained.

When the rear surfaces of the small-thickness portions 16b, 17b, and 18b of the leads 16 to 18 are formed in a planar shape to make the thicknesses of the small-thickness portions 16b, 17b, and 18b constant, the range of the thickness d2 thereof appropriately ranges from ¼ to ¾ of the thickness d1 of the base portions 16a, 17a, and 18a, preferably ranges from ⅓ to ⅔, and is particularly preferably ½.

When the thickness d2 of the small-thickness portions 16b, 17b, and 18b is greater than the range, the magnitude t2 of the gap G may excessively increase. When the thickness d2 is smaller than the range, shaping may be disabled in the press punching.

The magnitude (a cutting width of the leads, a punching width of the leads, or a case resin width) t2 of the gap G between the small-thickness portion 16b of the lead 16 and the small-thickness portions 17b and 18b of the leads 17 and 18 appropriately ranges from 0.1 mm to 0.2 mm, preferably ranges from 0.125 mm to 0.175 mm, and is particularly preferably 0.15 mm.

When the magnitude t2 of the gap G is greater than the range, the length L of the bonding wire 13 may excessively increase. When the magnitude t2 is smaller than the range, satisfactory insulation may not be obtained between the leads 16 to 18 to cause disconnection failure.

When the leads 16 to 18 are cut out by the press punching, the width of the punch needs to be set to be larger than at least 0.9 times to 1.2 times the thickness d2 of the small-thickness portions 16b, 17b, and 18b of the leads 16 to 18 in order to secure the strength of the punch of the press punching machine and thus the magnitude t2 of the gap G ranges from 0.9 times to 1.2 times the thickness d2.

The surfaces of the protruding parts 17c and 18c of the leads 17 and 18 are curved by the press punching, and it is thus difficult to bond the bonding wires 13 to the protruding parts 17c and 18c.

Accordingly, the width t1 of the bonding-disabled areas 17d and 18d of the leads 17 and 18 is determined depending on the widths of the protruding parts 17c and 18c and the bonding accuracy of the bonding wires 13, and t1=0.1 mm is set.

The surfaces of the protruding parts 16c of the lead 16 are curved by the press punching and it is thus difficult to mount the LED chips 11 and 12 on the protruding parts 16c.

Accordingly, the width t3 of the mounting-disabled areas 16d of the lead 16 is determined depending on the widths of the protruding parts 16c and the mounting accuracy of the LED chips 11 and 12, and t3=0.1 mm is set.

The width t4 from the edges of the LED chips 11 and 12 to the wire balls 13a of the bonding wires 13 is determined depending on the sizes of the LED chips 11 and 12 and the electrode positions and t4=0.01 mm to 0.25 mm is set.

The radius t5 of the wire ball 13a is set to t5=0.04 mm.

When the outer diameter of the bonding wire 13 is 0.025 mm, the length t6 of the bent part 13b of the bonding wire 13 appropriately ranges from 0.03 mm to 0.12 mm, preferably ranges from 0.05 mm to 0.095 mm, and is particularly preferably 0.07 mm.

When the length t6 of the bent part 13b is greater the range, a capillary of a wire bonding machine may come in contact with the sealing frame portion 19c of the packaging resin portion 19. By setting the length t6 of the bent part 13b to be larger than the outer diameter of the bonding wire 13, it is possible to stably form the bent part 13b.

The length L of the bonding wire 13 in a plan view of the light emitting device 10 is L=t1+t2+t3+t4+t5+t6, and L=0.52 mm when t1=0.1 mm, t2=0.15 mm, t3=0.1 mm, t4=0.06 mm, t5=0.04 mm, and t6=0.07 mm are set.

Method of Manufacturing Bent Part 13b of Bonding Wire 13

Figure 3A:
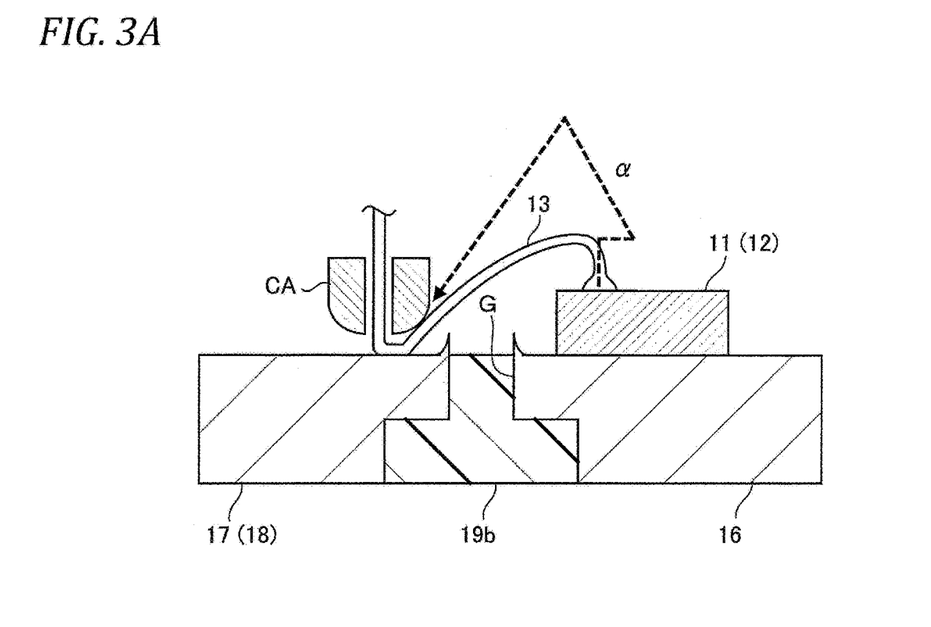
FIGS. 3A and 3B are diagrams illustrating a method of manufacturing a bent part 13b of a bonding wire 13 in the light emitting device 10.

As indicated by an arrow α in FIG. 3A, in a normal wire bonding method, the bonding wires 13 are ball-bonded to the LED chips 11 and 12, the capillary CA of the wire bonding machine is raised, then the capillary CA is linearly lowered, and the bonding wires 13 are wedge-bonded to the leads 17 and 18.

Figure 3B:
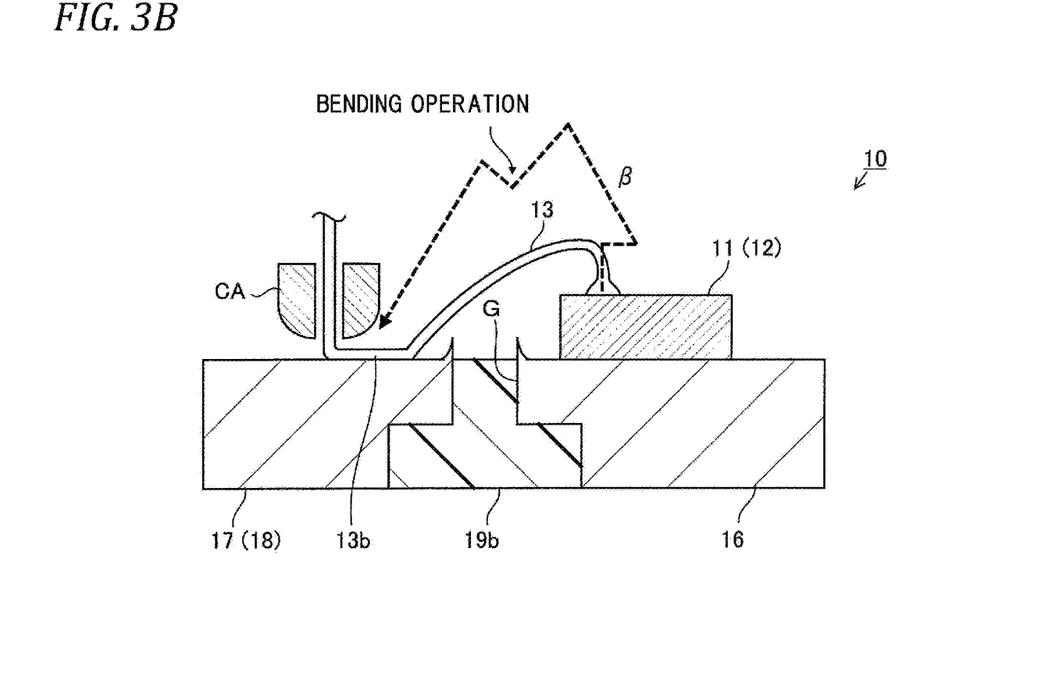

As indicated by an arrow β in FIG. 3B, in the first embodiment, the bonding wires 13 are ball-bonded to the LED chips 11 and 12, the capillary CA of the wire bonding machine is raised, then a bending operation of linearly lowering the capillary CA to a certain extent and then slightly raising the capillary CA is added, the capillary CA is linearly lowered subsequently, and the bonding wires 13 are wedge-bonded to the leads 17 and 18.

It is possible to easily form the bent parts 13b in the bonding wires 13 by this bending operation and to appropriately set the length t6 of the bent part 13b by controlling the distance by which the capillary CA is raised by the bending operation.

Operational Advantages of First Embodiment

In the light emitting device 10 according to the first embodiment, the following operational advantages can be obtained.

[1] In the light emitting device 10, the small-thickness portions 16b, 17b, and 18b are formed in the leads 16 to 18, respectively, the magnitude t2 of the gap G between the small-thickness portion 16b of the lead 16 and the small-thickness portions 17b and 18b of the leads 17 and 18 is set to 0.9 times to 1.2 times the thickness d2 of the small-thickness portions 16b, 17b, and 18b.

That is, since the magnitude t2 of the gap G can be set to be less than the thickness d1 of the base portions 16a, 17a, and 18a of the leads 16 to 18 by forming the small-thickness portions 16b, 17b, and 18b in the leads 16 to 18, the length L of the bonding wire 13 in a plan view of the light emitting device 10 can be set to be smaller than a value which is obtained by adding the thickness d1, the width t3 of the mounting-disabled area 16d, and the width t1 of the bonding-disabled area 18d (L<d1+t1+t3).

In order for the sealing resin portion 20 to seal the bonding wires 13, a synthetic resin material (sealing resin) forming the sealing resin portion 20 is filled below the bonding wires 13.

Accordingly, when the length L of the bonding wires 13 can be reduced, the volume of the sealing resin filled below the bonding wire 13 is reduced, expansion/contraction of the sealing resin due to heat is reduced, and a stress applied to the bonding wire 13 from the sealing resin is reduced. As a result, it is possible to control metal fatigue of the bonding wire 13 and to make it difficult to cause disconnection failure of the bonding wire 13.

A synthetic resin material having a larger linear expansion coefficient (for example, a linear expansion coefficient 100 ppm or greater) than that of the bonding wire 13 can be used as the material of the sealing resin portion 20.

Figure 4:
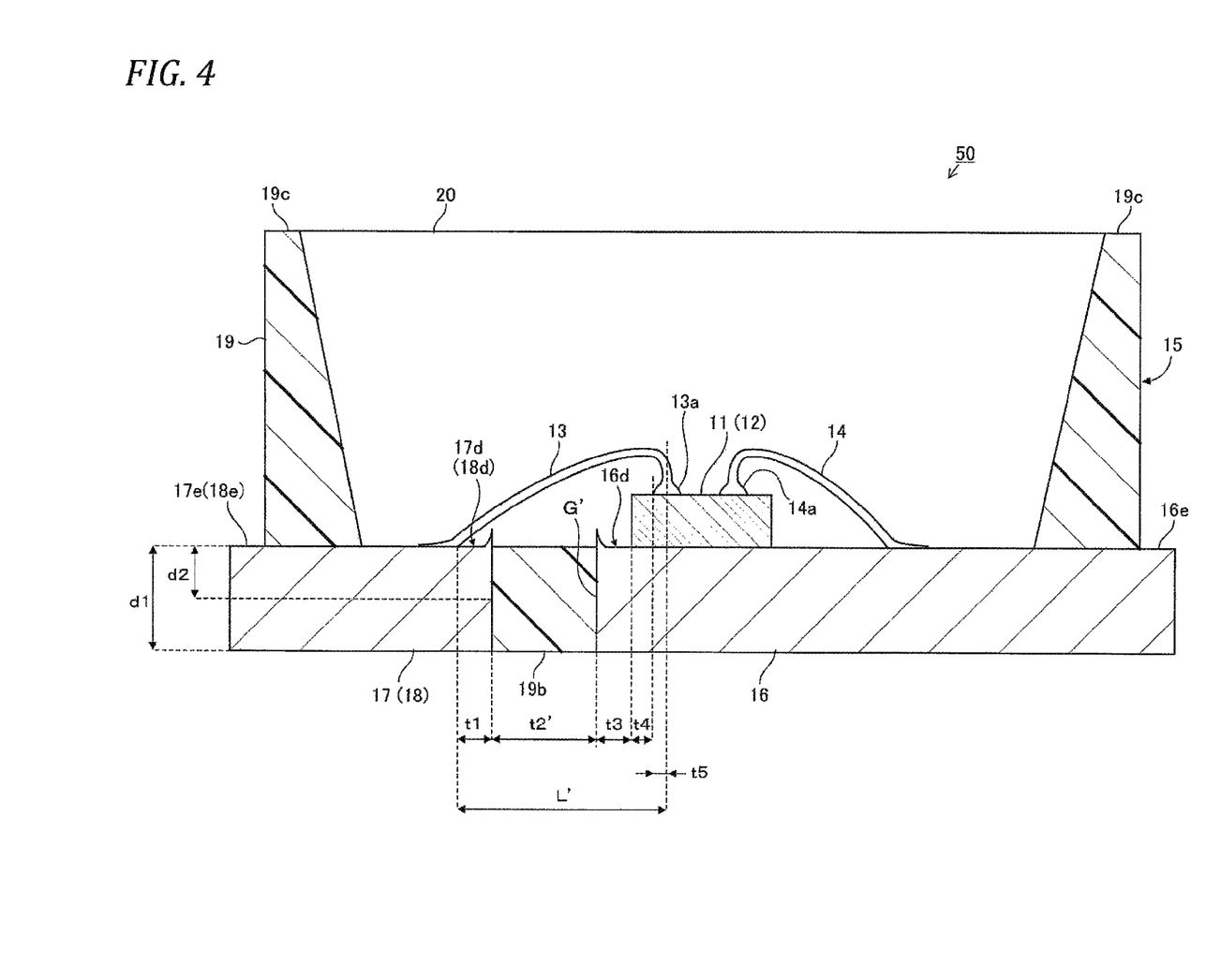
FIG. 4 is a perspective cross-sectional view of a light emitting device 50 according to the related art.

As illustrated in FIG. 4, in a light emitting device 50 according to the related art, since the small-thickness portions 16b, 17b, and 18b are not formed in the leads 16 to 18, the magnitude t2' of the gap G' between the lead 16 and the leads 17 and 18 is larger than the magnitude t2 of the gap G in the light emitting device 10 according to the first embodiment illustrated in FIG. 2.

That is, when the leads 16 to 18 are cut out by the press punching, the width of the punch needs to be set to be greater than at least 0.9 times to 1.2 times the thickness d1 of the leads 16 to 18 in order to secure the strength of the punch of the press punching machine. Accordingly, the magnitude t2' of the gap G' ranges 0.9 times to 1.2 times the thickness d1.

Accordingly, the length L' of the bonding wires 13 in a plan view of the light emitting device 50 increases, the volume of the sealing resin filled below the bonding wire 13 increases, expansion/contraction of the sealing resin due to heat increases, and a stress applied to the bonding wire 13 from the sealing resin increases. As a result, the metal fatigue of the bonding wire 13 is likely to increase and it is easy to cause disconnection failure.

[2] Since the volume of the sealing resin of the sealing resin portion 20 filled below the bonding wire 13 is reduced by the volume of the protruding parts 16c, 17c, and 18c of the leads 16 to 18, it is possible to more reliably achieve the operational advantage of [1].

[3] Since the bent parts 13b of the bonding wires 13 serve as an elongation margin corresponding to deformation of the sealing resin portion 20, the stress applied to the bonding wires 13 due to deformation of the sealing resin portion 20 is absorbed by the bent parts 13b. Accordingly, it is possible to control metal fatigue of the bonding wires 13 and to make it difficult to cause disconnection failure of the bonding wires 13.

The stress of the sealing resin portion 20 easily affects the surroundings of the leads 17 and 18, that is, the surroundings of the bonding area and the bonding-disabled areas 17d and 18d, due to a difference in linear expansion coefficient. In addition, when the protruding parts 17c and 18c are present in the bonding-disabled areas 17d and 18d, the area therebetween is affected by the stress.

The bent parts 13b of the bonding wires 13 are bent and drawn along the surfaces of the leads 17 and 18 so as to serve as an elongation margin corresponding to the shapes of the leads 17 and 18.

Since the bent parts 13b are bent and drawn along the surface of the leads 17 and 18, a gap is hardly present between the bent parts 13b and the surfaces of the leads 17 and 18 and the volume of the sealing resin of the sealing resin portion 20 filled between the bent parts 13b and the surfaces of the leads 17 and 18 is very small. Accordingly, the stress applied to the bent parts 13b from the sealing resin is very small and thus the bent parts 13b may hardly cause metal fatigue due to the stress.

Second Embodiment

Figure 5:
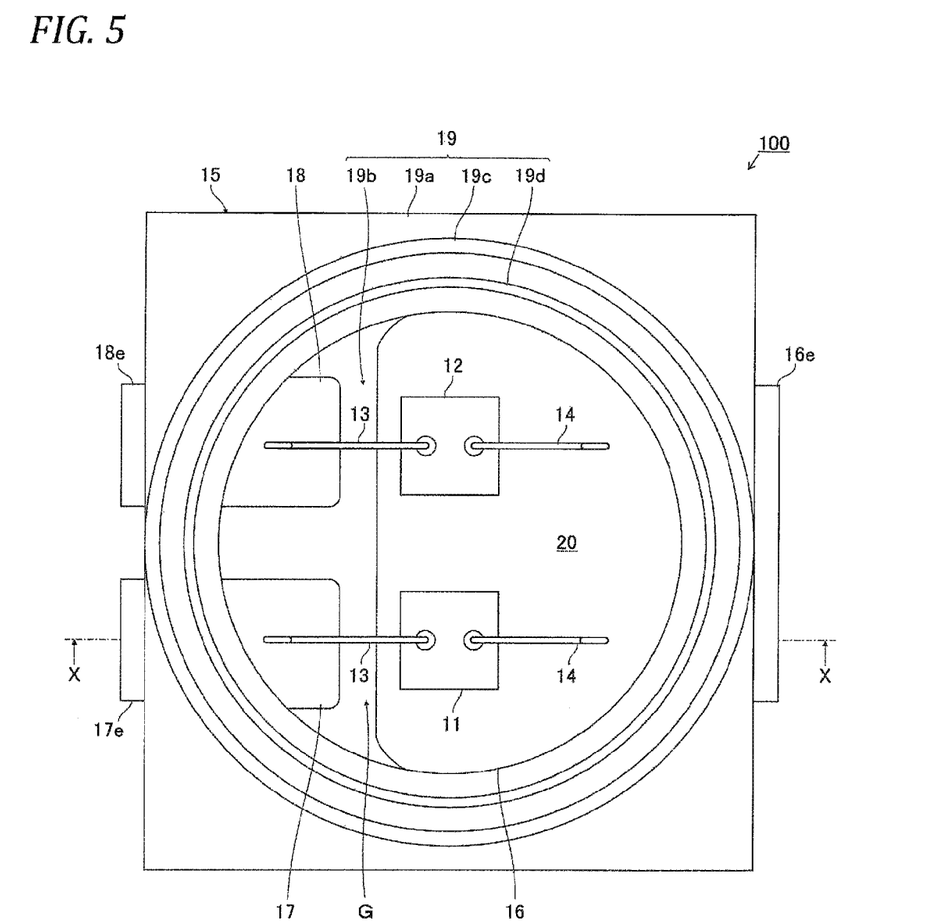
FIG. 5 is a plan view of a light emitting device 100 according to a second embodiment of the present invention.
Figure 6:
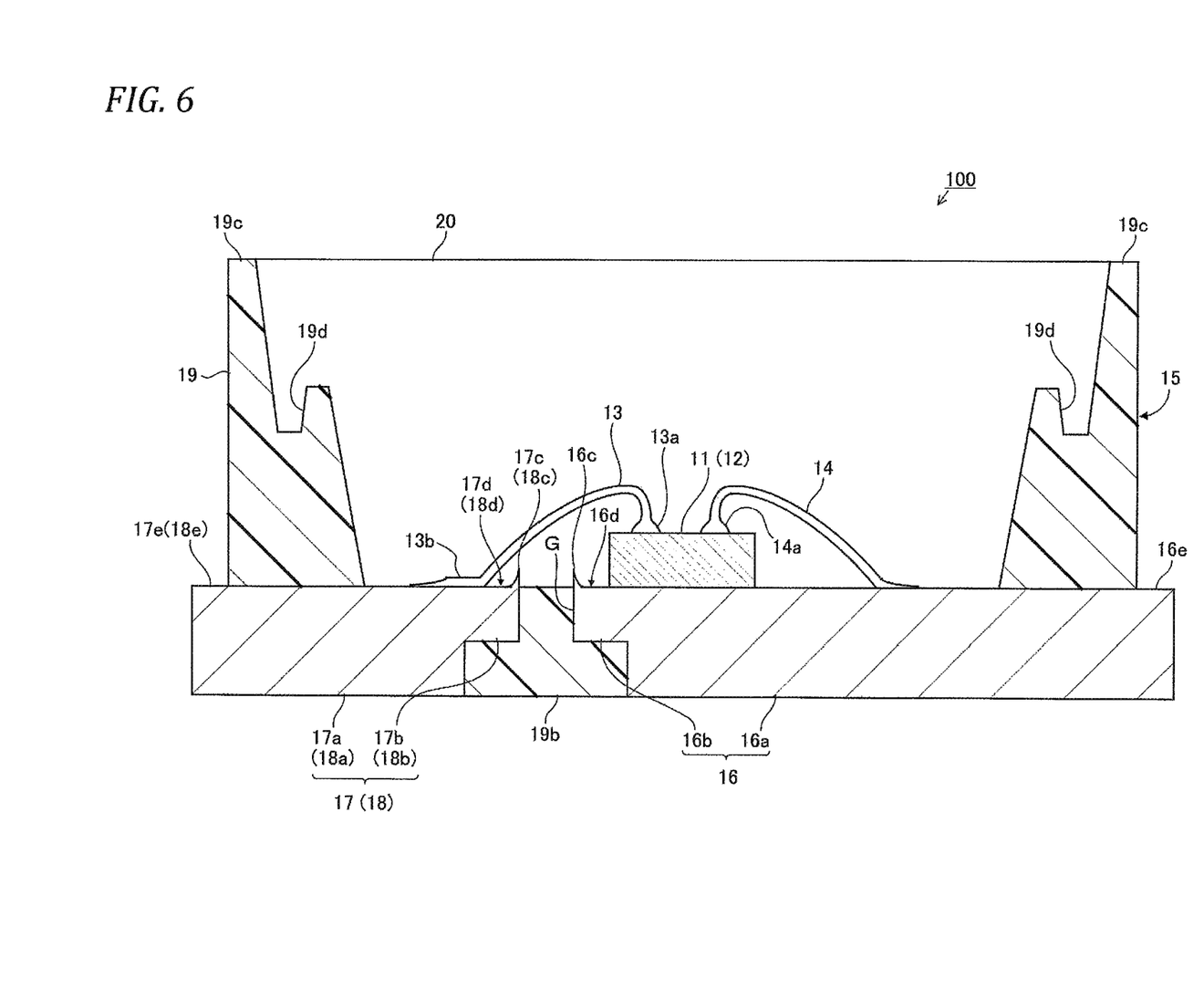
FIG. 6 is a perspective cross-sectional view of the light emitting device 100 taken along line X-X in FIG. 4.

As illustrated in FIGS. 5 and 6, a light emitting device 100 according to a second embodiment of the present invention includes LED chips 11 and 12, bonding wires 13 and 14 (wire balls 13a and 14a and bent parts 13b), a package portion 15, a first lead 16 (a first base portion 16a, a first small-thickness portion 16b, a first protruding part 16c, a mounting-disabled area 16d, and an external connection terminal 16e), a second lead 17 (a second base portion 17a, a second small-thickness portion 17b, a second protruding part 17c, a bonding-disabled area 17d, and an external connection terminal 17e), a second lead 18 (a second base portion 18a, a second small-thickness portion 18b, a second protruding part 18c, a bonding-disabled area 18d, and an external connection terminal 18e), a packaging resin portion 19 (a base portion 19a, an insulating portion 19b, a sealing frame portion 19c, and an anchor groove 19d), a sealing resin portion 20, and a gap G.

The light emitting device 100 according to the second embodiment is different from the light emitting device 10 according to the first embodiment, in that the anchor groove 19d is formed in the sealing frame portion 19c of the packaging resin portion 19.

The anchor groove 19d is formed over the entire circumference of the inner circumferential surface of the sealing frame portion 19c and is punched in a direction substantially perpendicular to the surfaces of the leads 16 to 18.

The sealing resin of the sealing resin portion 20 is also filled in the anchor groove 19d.

Figure 7A:
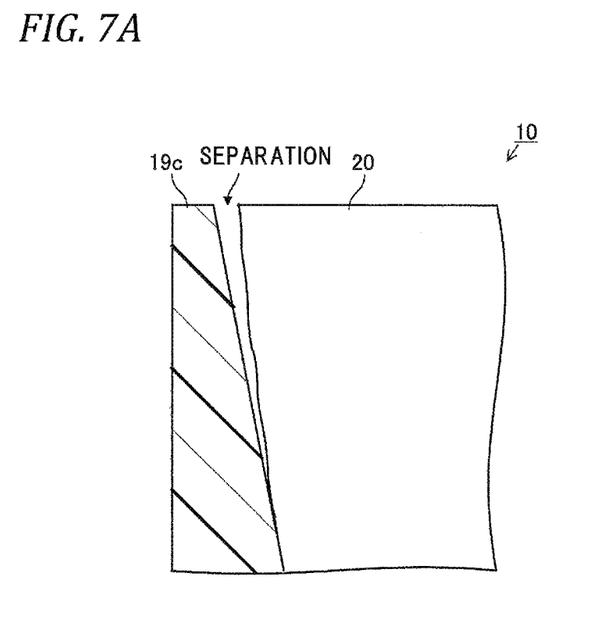
FIGS. 7A and 7B are partial cross-sectional views illustrating operational advantages of the light emitting device 100.

As illustrated in FIG. 7A, in the light-emitting device 10 according to the first embodiment, when the sealing resin portion 20 contracts due to heat, the sealing resin portion 20 may be separated from the inner circumferential surface of the sealing frame portion 19c.

Figure 7B:
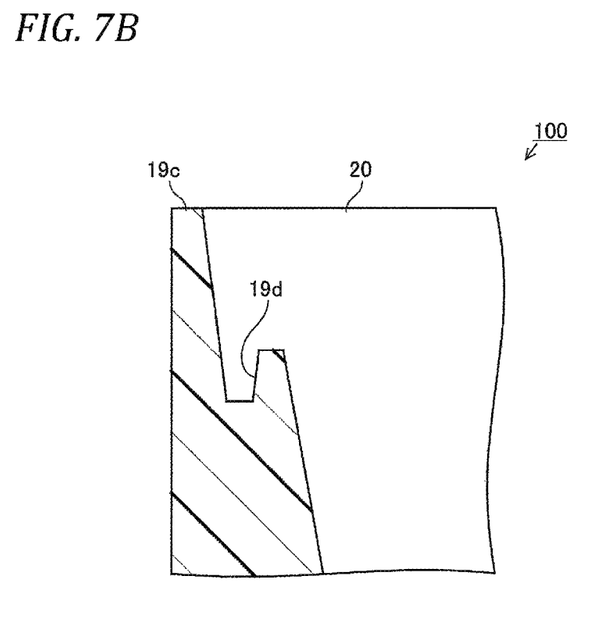

On the contrary, as illustrated in FIG. 7B, in the light emitting device 100 according to the second embodiment, even when the sealing resin portion 20 contracts due to heat, the sealing resin portion 20 is hooked to the sealing resin filled in the anchor groove 19d and it is thus possible to satisfactorily prevent the sealing resin portion 20 from being separated from the inner circumferential surface of the sealing frame portion 19c.

Since the sealing resin portion 20 is hooked to the anchor groove 19d, it is possible to additionally reduce the stress applied to the bonding wires 13 and to further suppress metal fatigue of the bonding wires 13.

Third Embodiment

Figure 8A:
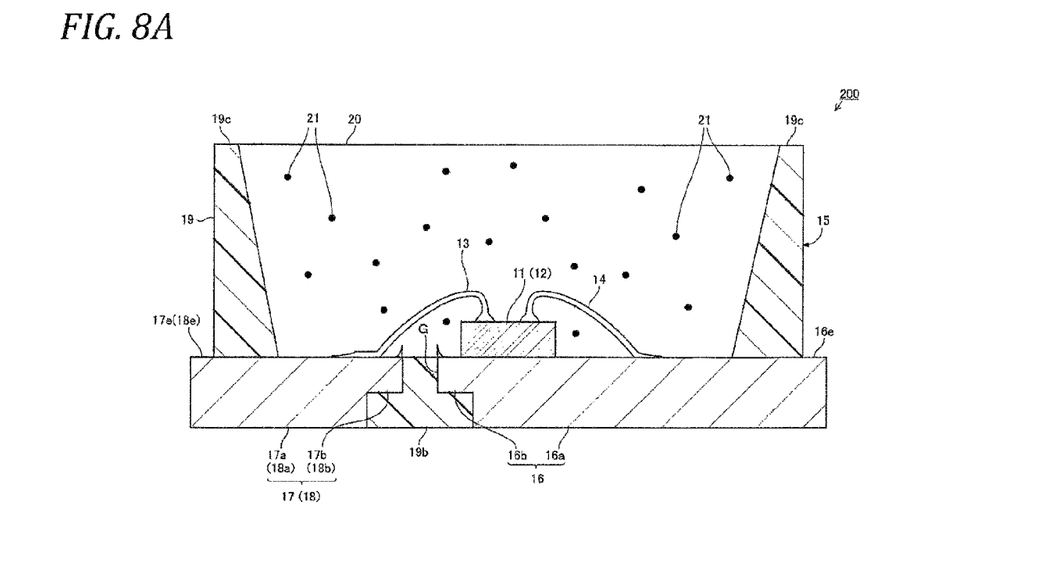
FIGS. 8A and 8B are perspective cross-sectional views illustrating a method of manufacturing a light emitting device 200 according to a third embodiment of the present invention.
Figure 8B:
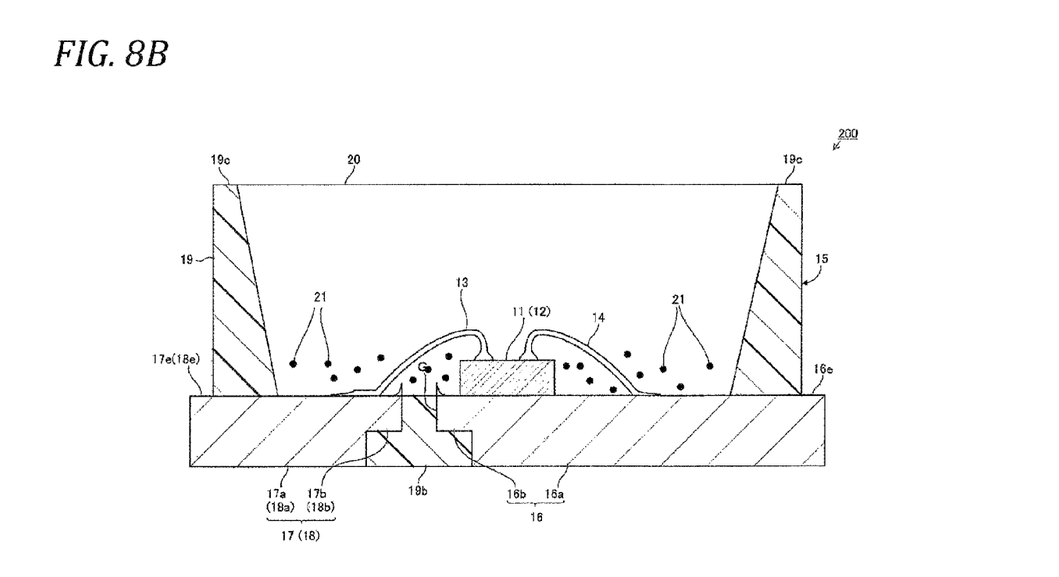

As illustrated in FIG. 8, a light emitting device 200 according to a third embodiment of the present invention includes LED chips 11 and 12, bonding wires 13 and 14, a package portion 15, a first lead 16 (a first base portion 16a, a first small-thickness portion 16b, and an external connection terminal 16e), a second lead 17 (a second base portion 17a, a second small-thickness portion 17b, and an external connection terminal 17e), a second lead 18 (a second base portion 18a, a second small-thickness portion 18b, and an external connection terminal 18e), a packaging resin portion 19 (a base portion 19a, an insulating portion 19b, and a sealing frame portion 19c), a sealing resin portion 20 (fluorescent particles 21), and a gap G.

The light emitting device 200 according to the third embodiment is different from the light emitting device 10 according to the first embodiment, in that fluorescent particles 21 are arranged in the sealing resin portion 20.

When the fluorescent particles 21 are arranged in the sealing resin portion 20, the linear expansion coefficient of the sealing resin portion 20 can decrease and it is thus possible to more reliably achieve the operational advantage of [1] in the first embodiment.

In order to achieve the operational advantage of [1] in the first embodiment, it is preferable that the fluorescent particles 21 be arranged particularly in the vicinity of the bonding wires 13.

For this purpose, first, as illustrated in FIG. 8A, by adding fluorescent particles 21 to the sealing resin in filling the sealing frame portion 19c with the sealing resin of the sealing resin portion 20, the fluorescent particles 21 are dispersed and arranged in the sealing resin portion 20.

Subsequently, as illustrated in FIG. 8B, by precipitating the fluorescent particles 21 in the sealing resin portion 20, the fluorescent particles 21 are arranged in the vicinity of the bonding wires 13.

Examples of the method of precipitating the fluorescent particles 21 in the sealing resin portion 20 include a method using centrifugal separation and a method of lowering viscosity of the sealing resin by appropriately changing the temperature in filling the sealing frame portion 19c with the sealing resin of the sealing resin portion 20.

When the fluorescent particles 21 are replaced with an inorganic filler having a smaller linear expansion coefficient than that of the sealing resin portion 20, the linear expansion coefficient of the sealing resin portion 20 can also be lowered and it is thus possible to achieve the same operational advantages as in the third embodiment.

By forming the inorganic filler out of a material (such as alumina, titanium oxide, or silicon oxide) having a light reflecting property or a light scattering property, it is possible to control light emitted from the light emitting device 200.

Other Embodiments

The present invention is not limited to the above-mentioned embodiments, but may be embodied as follows. In this case, operational advantages equivalent to or more excellent than those of the above-mentioned embodiments.

[A] The LED chips 11 and 12 may be replaced with any semiconductor light emitting element. The LED chips 11 and 12 are not limited to the face-up type, but may be replaced with an upper/lower electrode type. The bonding wires 14 can be omitted in the upper/lower electrode type.

[B] The present invention is not limited to the top-view type light emitting device 10, but may be applied to a side-view type light emitting device.

The present invention is not limited to the SMD light emitting device 10, but may be applied to light emitting devices such as a shell type, a chip-on-board (COB) type, and a substrate type.

[C] The shape of the rear surfaces of the small-thickness portions 16b, 17b, and 18b of the leads 16 to 18 is not particularly limited, as long as the surfaces thereof are flush with the surfaces of the base portions 16a, 17a, and 18a.

In the above-mentioned embodiments, the rear surfaces of the small-thickness portions 16b, 17b, and 18b have the same planar shape as the rear surfaces of the base portions 16a, 17a, and 18a, but the rear surfaces of the small-thickness portions 16b, 17b, and 18b may have an inclined surface shape.

For example, when an inclined surface is formed such that the thickness of the small-thickness portions 16b, 17b, and 18b decreases toward the base portions 16a, 17a, and 18a, the material of the packaging resin portion 19 serves as an undercut of the small-thickness portions 16b, 17b, and 18b and it is thus possible to improve mechanical connection strength of the leads 16 to 18.

From the same viewpoint, the rear surfaces of the small-thickness portions 16b, 17b, and 18b may be formed in an uneven shape.

In this way, the thickness of the small-thickness portions 16b, 17b, and 18b is not constant, the same operational advantages as in the first embodiment can be obtained by setting the thicknesses of the edges of the small-thickness portions 16b, 17b, and 18b to be equal to each other.

[D] In the above-mentioned embodiments, a normal bonding method of ball-bonding the bonding wires 13 to the LED chips 11 and 12 and then wedge-bonding the bonding wires 13 to the leads 17 and 18 is used as the bonding method of the bonding wires 13.

However, any bonding method may be used for bonding of the bonding wires 13.

For example, a security bonding (bump bonding) method may be used for bonding to the leads 17 and 18.

A ball stitch on ball (BSOB) bonding method (reverse bonding method) of ball-bonding the bonding wires to the leads 17 and 18 and then wedge-bonding the bonding wires to the LED chips 11 and 12 may be used. In this case, the bent parts 13b cannot be formed.

[E] The above-mentioned embodiments and the embodiments [A] to [C] may be appropriately combined for practice. In this case, the operational advantages of the combined embodiments can be added or a synergy effect thereof can be obtained.

The present invention is not limited to the above-mentioned aspects and the above-mentioned embodiments. Various modifications which can be considered by those skilled in the art without departing from the description of the appended claims are included in the present invention. Contents of the publication or the like mentioned in the specification are incorporated herein by reference in its entirety.

What is claimed is:
1. A light emitting device comprising:
a bonding wire of which a first end is bonded to a light emitting element;
a first lead in which the light-emitting element is mounted on the surface thereof and the rear surface thereof is exposed;
a second lead in which a second end of the bonding wire is bonded to the surface thereof and the rear surface thereof is exposed;

a packaging resin portion in which the first lead and the second lead are formed by insert molding and an insulating portion is formed between the first lead and the second lead; and a sealing resin portion that seals the light emitting element and the bonding wire, wherein:

the first lead includes a first base portion having a constant thickness and a first small-thickness portion connected to one side of the first base portion and having a thickness smaller than that of the first base portion;

the second lead includes a second base portion having a constant thickness and a second small-thickness portion connected to one side of the second base portion and having a thickness smaller than that of the second base portion;

the packaging resin portion also covers the rear surfaces of the first small-thickness portion and the second small-thickness portion;

the first small-thickness portion and the second small-thickness portion face each other with a gap interposed therebetween and the insulating portion is formed in the gap;

the length of the gap is 0.9 to 1.2 times the thickness of the edges of the first small-thickness portion and the second small-thickness portion;

a mounting-disabled area on which the light emitting element is not mounted is set on the surface of the first small-thickness portion;

a bonding-disabled area to which the bonding wire is not bonded is set on the surface of the second small-thickness portion; and the length of the bonding wire in a plan view of the light emitting device is smaller than a value obtained by adding the thickness of the base portion, the width of the mounting-disabled area, and the width of the bonding-disabled area.

2. The light emitting device according to claim 1, wherein:

the thickness of the first base portion and the thickness of the second base portion are equal to each other; and the thickness of the edge of the first small-thickness portion and the thickness of the edge of the second small-thickness portion are equal to each other.

3. The light emitting device according to claim 1, further comprising:

a first protruding part protruding from the surface of the edge of the first small-thickness portion; and a second protruding part protruding from the surface of the edge of the second small-thickness portion.

4. The light emitting device according to claim 1, further comprising a bent part formed by bending and drawing the second end of the bonding wire along the surface of the second lead, the bent part being formed in a part of the bonding wire connected to the second lead.

5. The light emitting device according to claim 1, wherein the length of the gap ranges from 0.1 mm to 0.2 mm.

6. The light emitting device according to claim 1, wherein the thickness of the base portion ranges from 0.3 mm to 0.64 mm.

7. The light emitting device according to claim 1, wherein the thickness of the base portion ranges from 0.1 mm to 1.00 mm.

8. The light emitting device according to claim 1, wherein the thickness of the base portion ranges from 0.2 mm to 0.8 mm.

9. The light emitting device according to claim 1, wherein the thickness of the edge of the first small-thickness portion and the thickness of the edge of the second small-thickness portion are each in a range of one-fourth to three-fourths the thickness of the first base portion and the thickness of the second base portion.

10. The light emitting device according to claim 1, wherein the thickness of the edge of the first small-thickness portion and the thickness of the edge of the second small-thickness portion are each in a range of one-third to two-thirds the thickness of the first base portion and the thickness of the second base portion.

11. The light emitting device according to claim 1, wherein the thickness of the edge of the first small-thickness portion and the thickness of the edge of the second small-thickness portion are each one-half the thickness of the first base portion and the thickness of the second base portion.

12. The light emitting device according to claim 1, wherein the length of the gap ranges from 0.125 mm to 0.175 mm.

13. The light emitting device according to claim 1, wherein a length of the bent part ranges from 0.03 mm to 0.12 mm.

14. The light emitting device according to claim 1, wherein a length of the bent part ranges from 0.05 mm to 0.095 mm.

15. The light emitting device according to claim 1, wherein a part of the light emitting element is disposed on the first small-thickness portion, and wherein the bonding-disabled area is a part of the surface of the second small-thickness portion.

* * * * *